United States Patent [19]

Sasaki

[11] Patent Number: 4,833,513
[45] Date of Patent: May 23, 1989

[54] MOS FET SEMICONDUCTOR DEVICE HAVING A CELL PATTERN ARRANGEMENT FOR OPTIMIZING CHANNEL WIDTH

[75] Inventor: Yoshitaka Sasaki, Yokohama, Japan

[73] Assignee: TDK Corporation, Tokyo, Japan

[21] Appl. No.: 251,006

[22] Filed: Sep. 27, 1988

Related U.S. Application Data

[63] Continuation of Ser. No. 819,869, Jan. 15, 1986, abandoned, which is a continuation of Ser. No. 180,693, Apr. 8, 1988, abandoned.

[30] Foreign Application Priority Data

Jan. 20, 1985 [JP] Japan .................................. 60-7906
Mar. 11, 1985 [JP] Japan .................................. 60-47741
Mar. 11, 1985 [JP] Japan .................................. 60-47742
Apr. 26, 1985 [JP] Japan .................................. 60-8492

[51] Int. Cl.[4] .................. H01L 29/78; H01L 27/02; H01L 23/48
[52] U.S. Cl. .............................. 357/23.4; 357/23.8; 357/41; 357/65; 357/68
[58] Field of Search .................. 357/23.4, 23.8, 41, 357/65, 68

[56] References Cited

U.S. PATENT DOCUMENTS 4,677,452 6/1987 Zommer ............................ 357/23.4

FOREIGN PATENT DOCUMENTS 0130508 1/1985 European Pat. Off. ........... 357/23.4
3114972 of 1982 Fed. Rep. of Germany ..... 357/23.4
2108758 5/1983 United Kingdom ............... 357/23.4

OTHER PUBLICATIONS

F. Mohammadi, "Silicide for Interconnection Technology," *Solid State Technology*, (Jan. 1981), pp. 65–72.

*Primary Examiner*—J. Carroll
*Attorney, Agent, or Firm*—Spencer & Frank

[57] ABSTRACT

A semiconductor device, i.e. diffusion-self-alignment MOS FET including an n type first semiconductor layer, a p type second semiconductor layer formed in a surface of the first semiconductor layer, an n+ type third semiconductor layer formed in the second semiconductor layer, a poly-silicon film pattern formed on the first semiconductor layer via a first insulating film, a second insulating film formed on the polysilicon film, and a metal electrode film formed on the second insulating film. A unit pattern of the second and third semiconductor layers and poly-silicon film have two or three enlarged portions and thin elongated portions connecting the enlarged portions to each other, and the metal electrode film is connected to the second and third semconductor layers through openings formed in the second insulating film within the enlarged portions. A number of unit patterns are arranged interdigitally.

18 Claims, 17 Drawing Sheets

FIG_1A
PRIOR ART
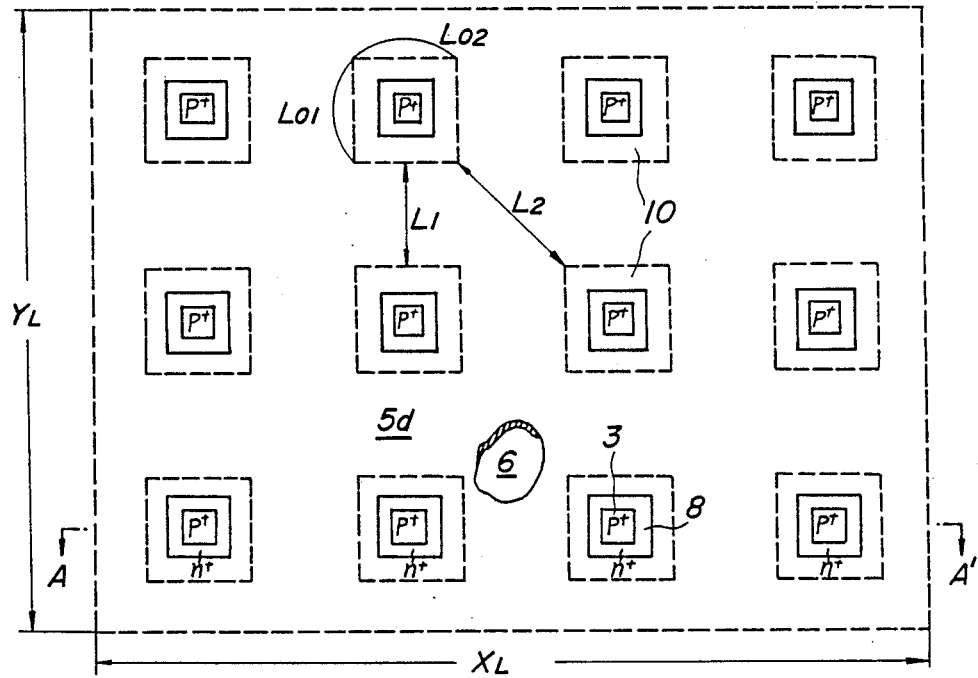
FIG_1B
PRIOR ART
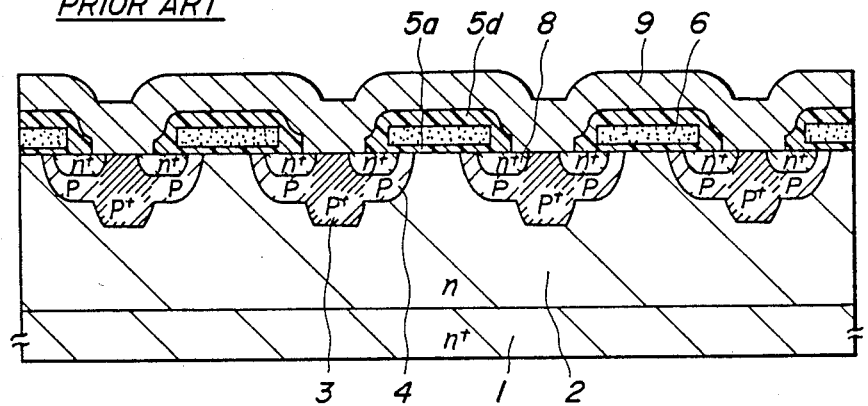

FIG_4A
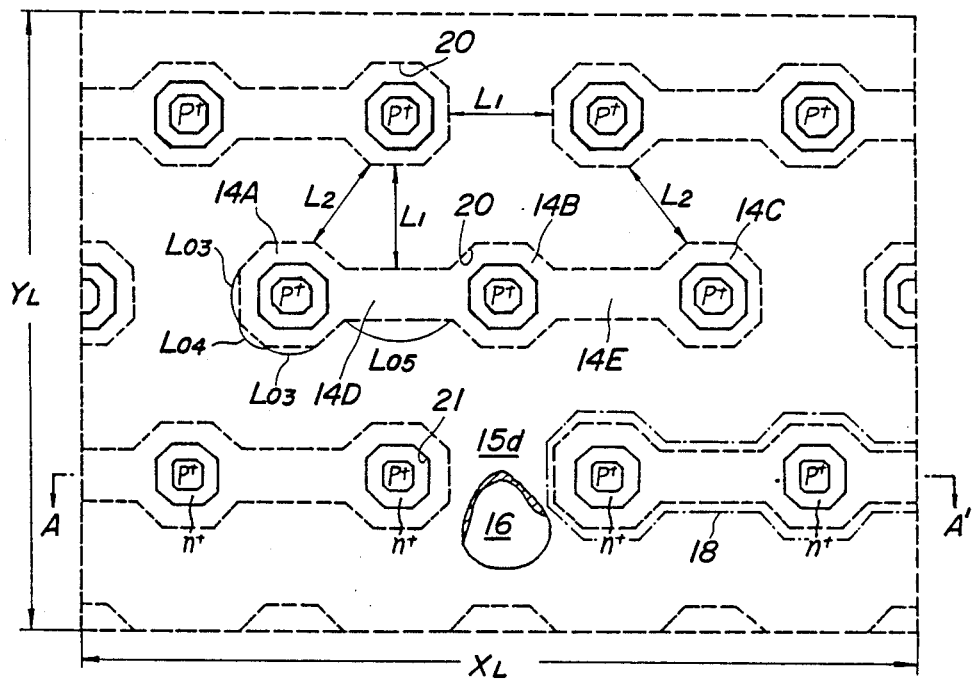
FIG_4B
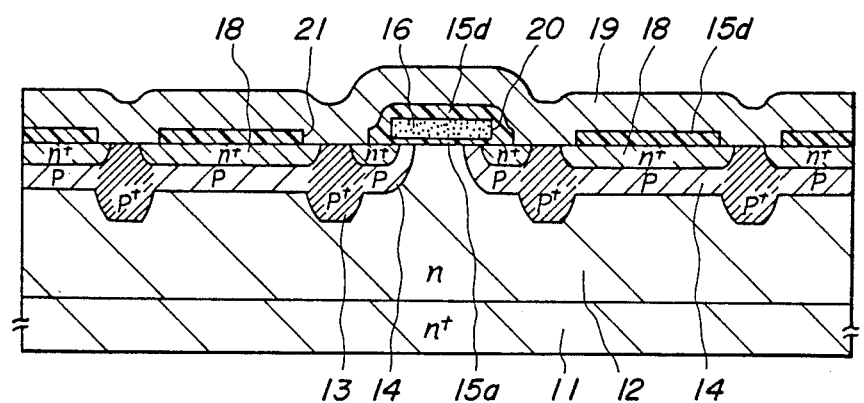

FIG_6
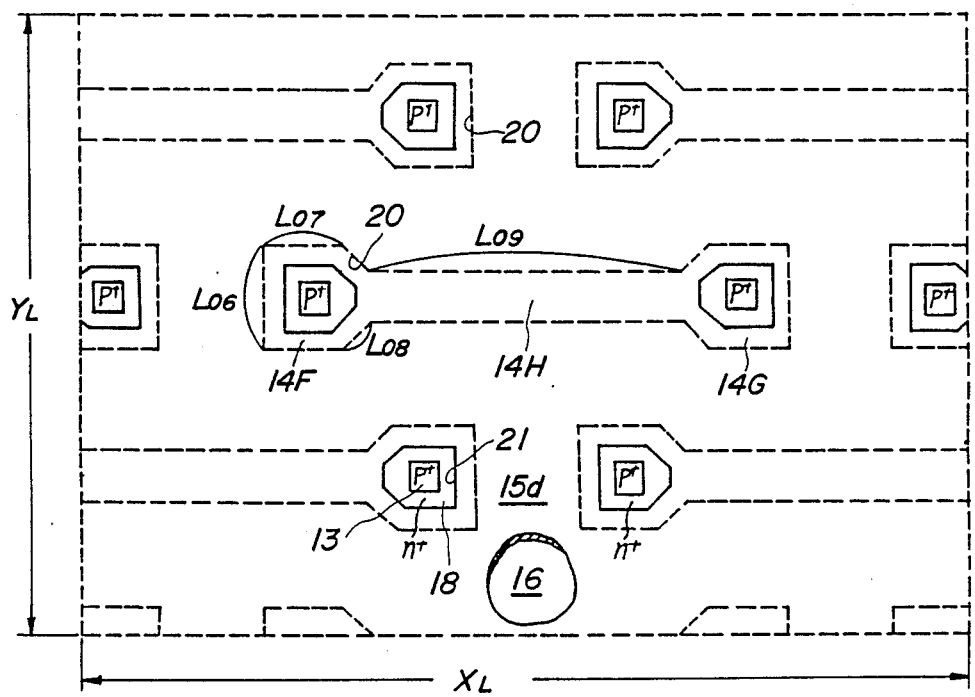

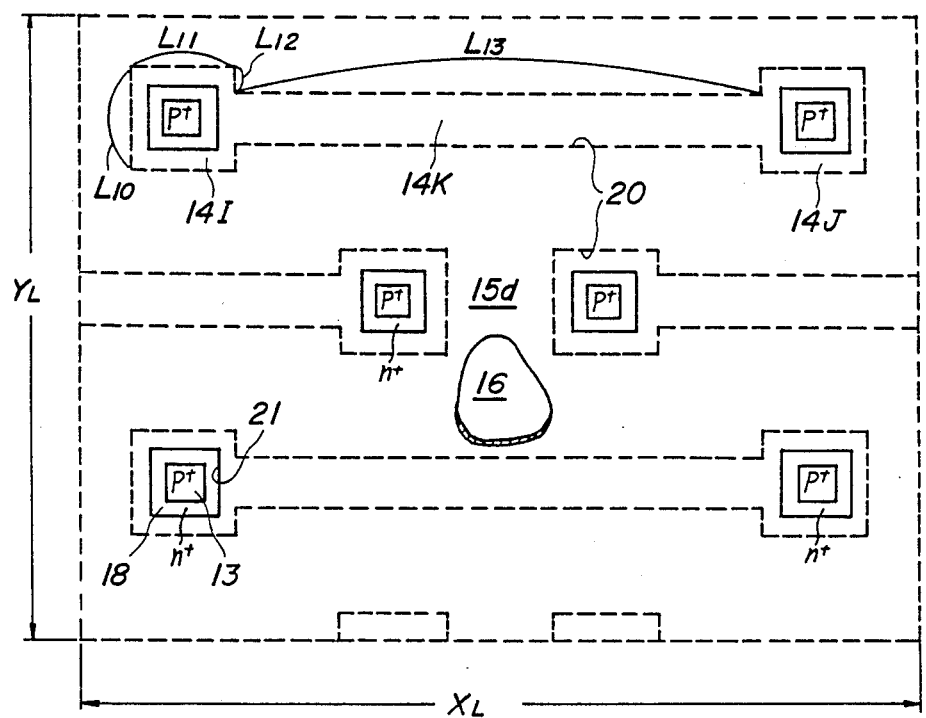
FIG_7

FIG_8A
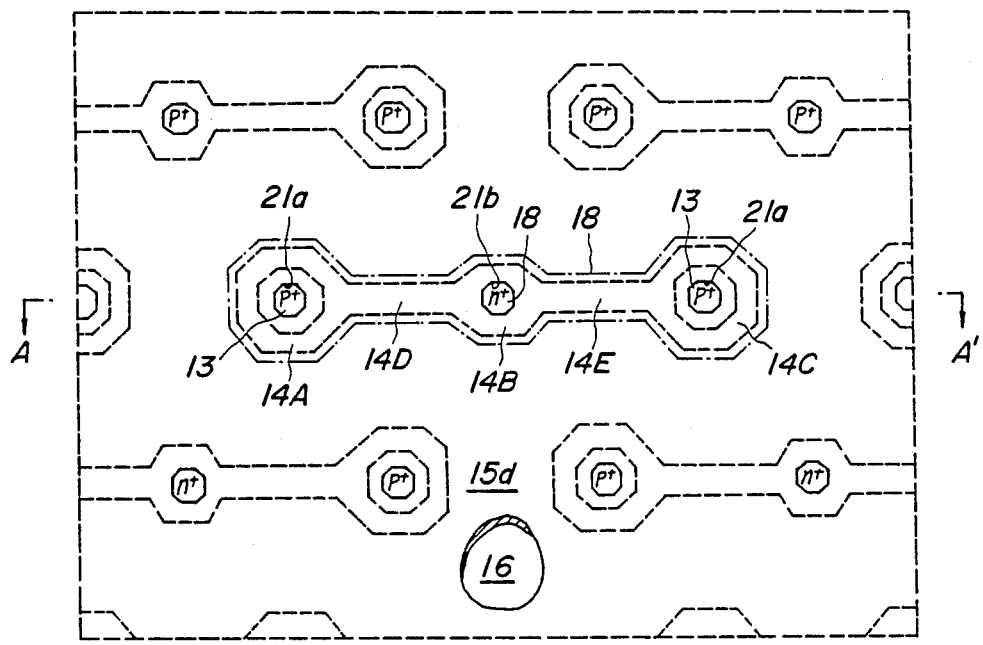
FIG_8B
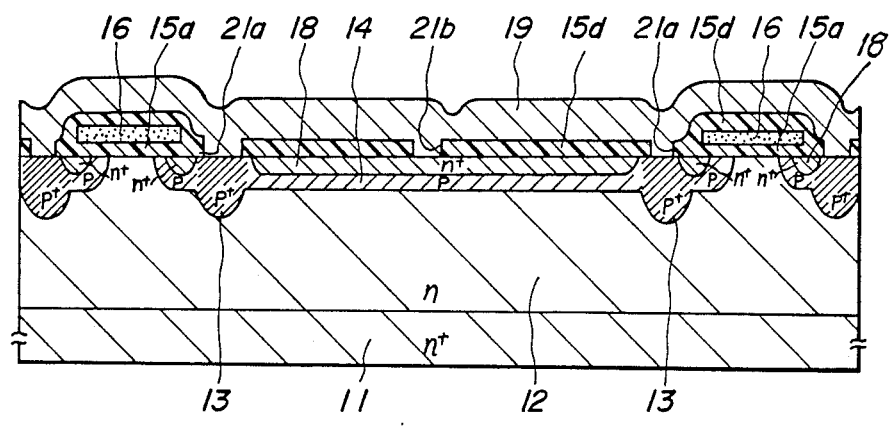

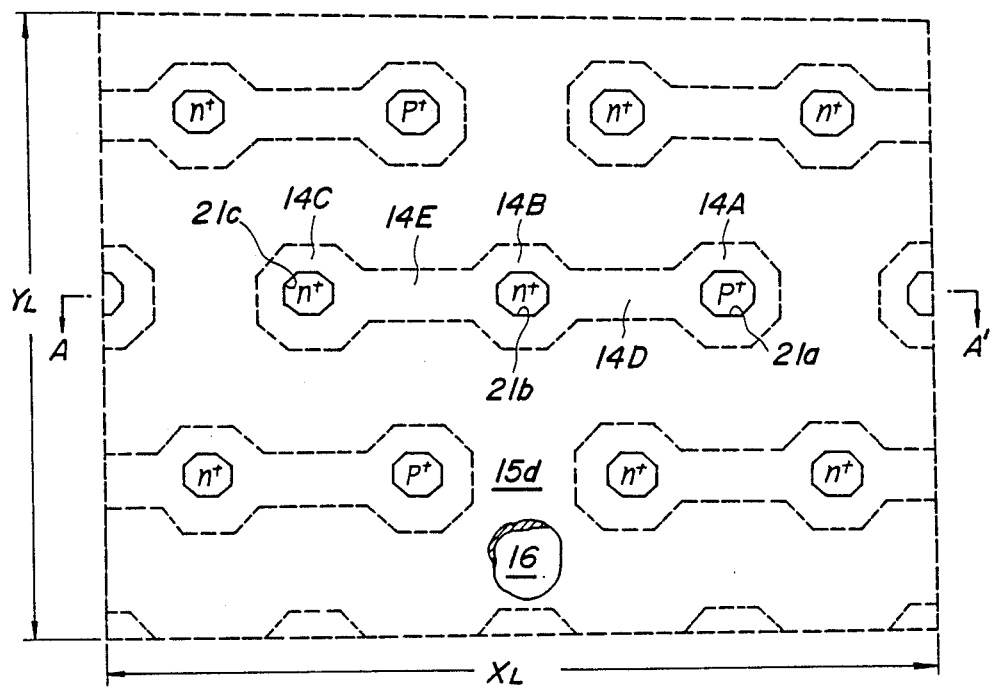
FIG_9A
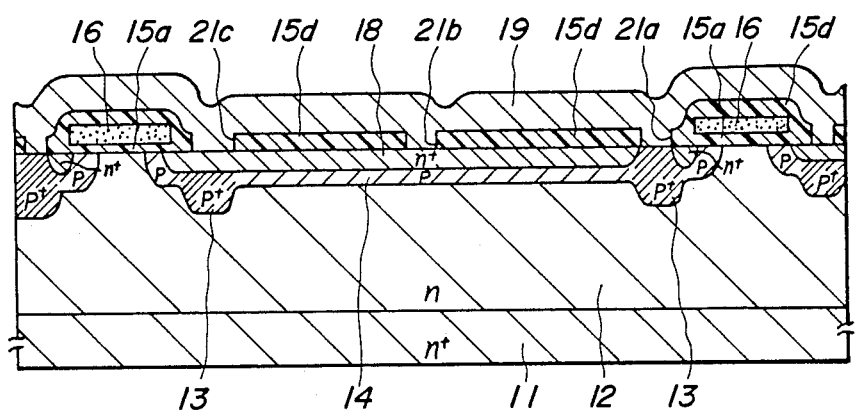
FIG_9B

FIG_11
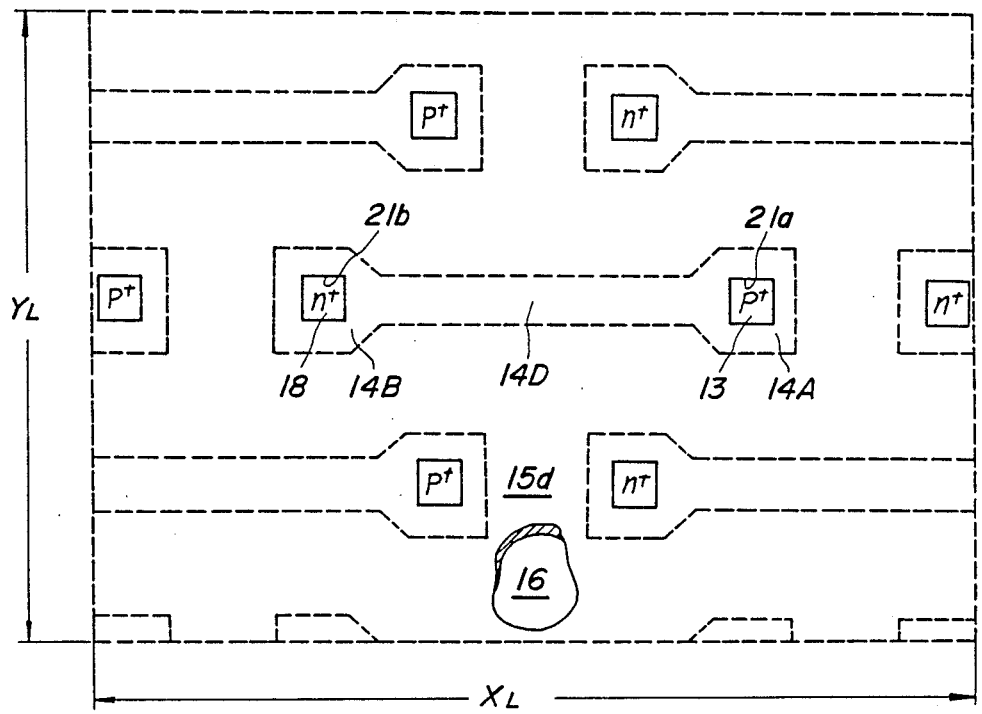

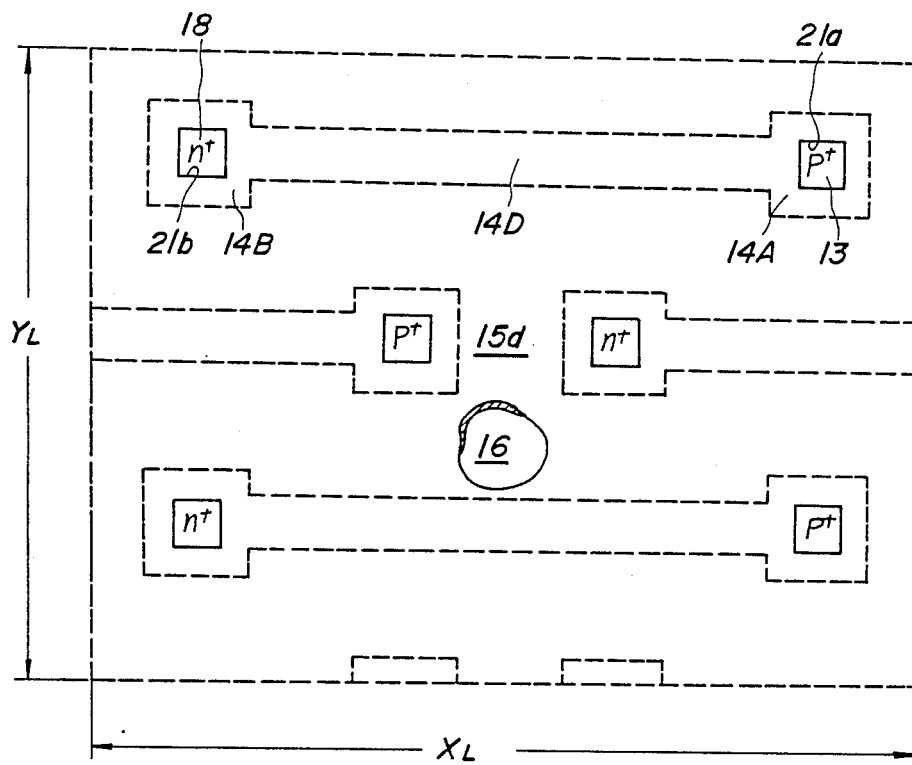
FIG_12

FIG_13D
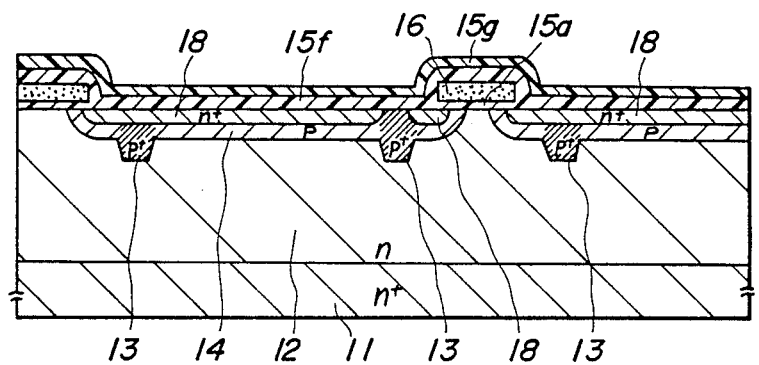
FIG_13E
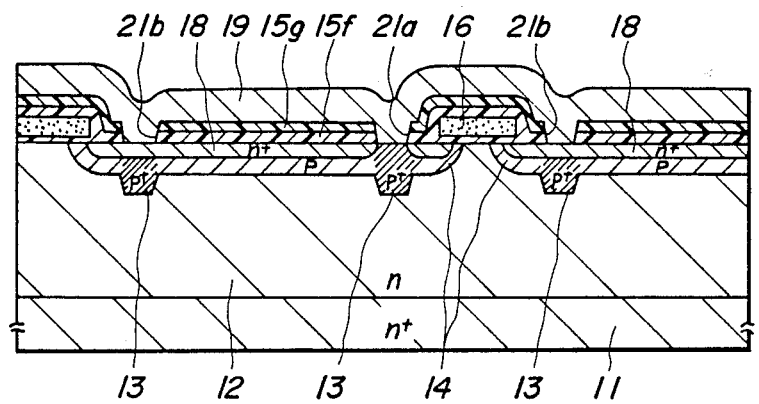

FIG_14A
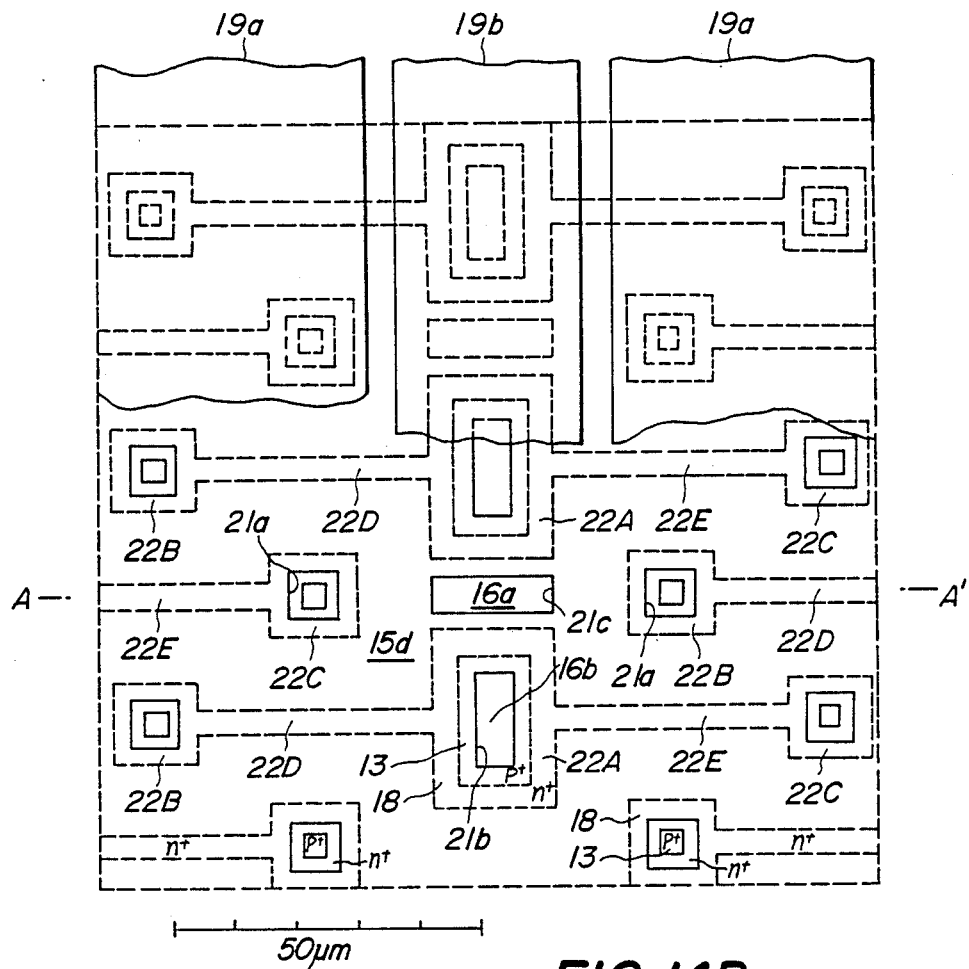
FIG_14B
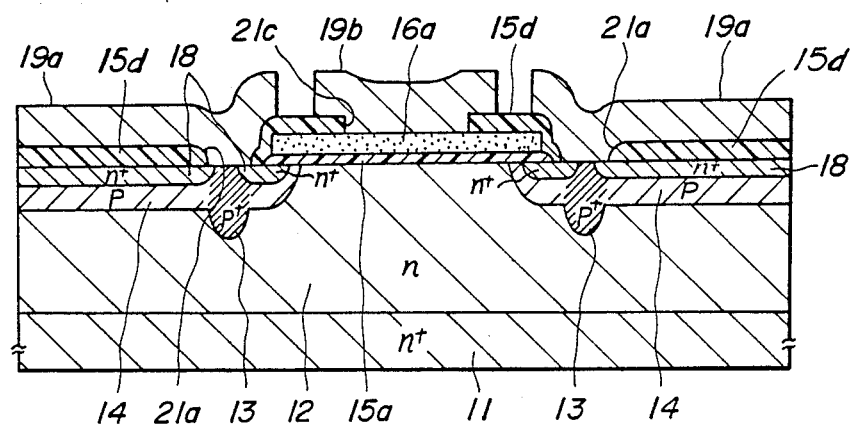

FIG_15A
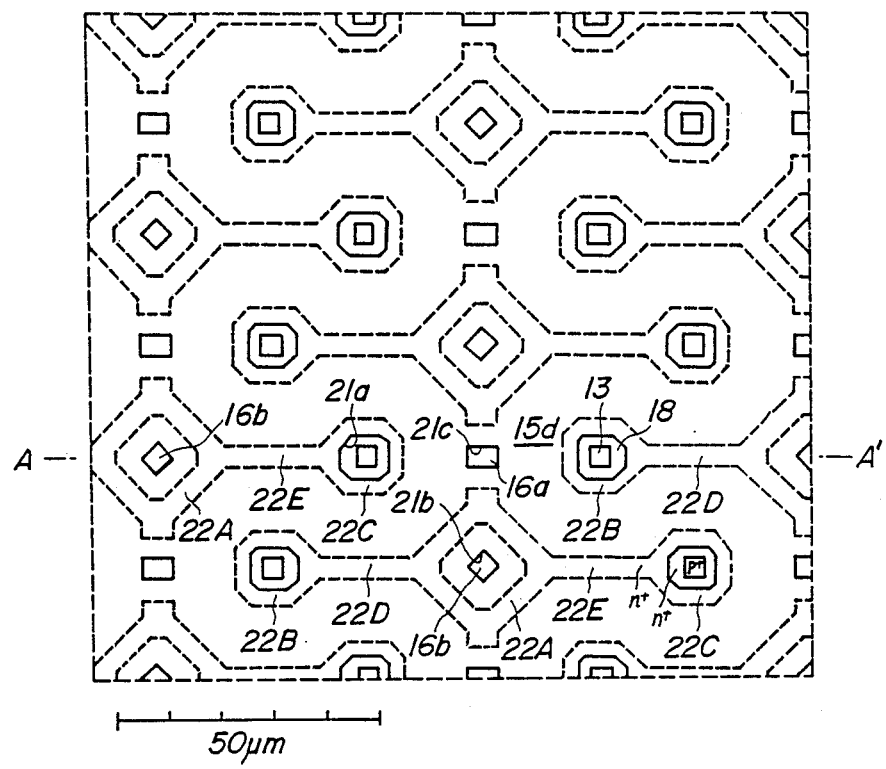
FIG_15B
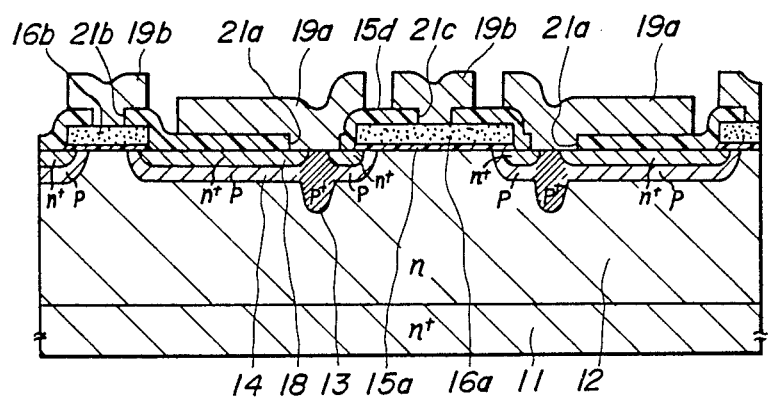

4,833,513

MOS FET SEMICONDUCTOR DEVICE HAVING A CELL PATTERN ARRANGEMENT FOR OPTIMIZING CHANNEL WIDTH

This application is a continuation of application Ser. No. 819,869, filed Jan. 15, 1986, now abandoned, which is a continuation of application Ser. No. 180,693, filed Apr. 8, 1988, now abandoned.

BACKGROUND OF THE INVENTION

Field of the Invention and Related Art Statement

The present invention generally relates to a semiconductor device, and more particularly to a MIS type semiconductor device for use in amplifying and switching.

Heretofore, among various MIS type semiconductor devices, the MOS FET has been considered a low voltage and low power device. However due to recent progress in semiconductor device manufacturing techniques and circuit design, it has become possible to develop a high voltage and high power MOS FET and such MOS FET has established its position in the field of semiconductor devices.

Typical constructions of the high voltage and high power MOS FET may be roughly classified into (a) off-set gate construction; (b) V-groove or U-groove construction and (c) Diffusion Self-Alignment Construction (hereinafter abbreviated as DSA). Among these constructions, the DSA construction is particularly preferable in view of the manufacturing technique and high performance.

FIG. 1A is a plan view showing a known DSA MOS FET and FIG. 1B is a cross sectional view thereof cut along a line A–A' in FIG. 1A. It should be noted that in FIG. 1A, the source electrode is wholly omitted for the sake of clearness.

In DSA MOS FET, a channel region is formed by a double diffusion and an impurity diffusion for forming the channel region (p type semiconductor layer 4) and an impurity diffusion for forming a source region (n+ type semiconductor layer 8) are effected through the same grid-like diffusion window formed in a gate poly-silicon film 6 provided on a gate oxide film 5a. The length of the channel region is defined by the difference in depth between the p type semiconductor layer 4 and n+ type semiconductor layer 8 and thus can be made extremely small e.g. smaller than a few microns. A source electrode 9 formed by a metal film deposited on an insulating film 5d is ohmic-contacted both with the n+ type semiconductor layer 8 constituting the source region and the p type semiconductor layer 4 forming the channel region. It should be noted that the source electrode 9 is actually brought into contact with a p+ type semiconductor layer 3 which is connected to the p type semiconductor region 4. In general, the gate electrode 6 is formed in the grid-like configuration or stripe-like configuration. In FIG. 1A there is shown a gate electrode of the grid-like configuration. An n+ type semiconductor substrate 1 forms a drain region and an n type semiconductor layer 2 is epitaxially grown on the substrate 1 to form a substrate of so-called n-on-n+ construction. A drain electrode not shown is formed on a rear surface of the substrate 1. When a positive voltage is applied across the source and drain, the channel region is made conductive and a current flows vertically from the substrate 1 through the channel region 4 into the source region 8.

Now the manufacturing method of the known DSA MOS FET shown in FIGS. 1A and 1B will be explained with reference to FIGS. 2A to 2F. On an n+ type silicon semiconductor substrate 1 is epitaxially grown an n type silicon semiconductor layer 2 having a resistivity of 10 to 25 Ωcm and a thickness of 30 to 60 μm. Then a p+ type silicon semiconductor layer 3 is formed in the surface of epitaxial semiconductor layer 2. Next a gate oxide film 5a having a thickness of about 1,000 Å is formed on the semiconductor layer 2. This condition is illustrated in FIG. 2A.

Next a poly-silicon film 6 having a thickness of about 6,000 Å is deposited on the gate oxide film 5a and is selectively etched into a given pattern. Then an ion injection is effected by using the poly-silicon pattern as a mask to form a p type silicon semiconductor layer 4. FIG. 2B shows the semiconductor device at this manufacturing stage.

Next a photoresist film 7 is selectively formed by using the photoetching technique to form openings in the gate oxide film 5a at portions where a source region is to be formed later. The semiconductor device at this manufacturing stage is shown in FIG. 2C.

Then an n+ type semiconductor layer 8 constituting the source region is formed in the p type semiconductor layer 4 by ion implantation in a self-aligned manner. Then an insulating film 5b is formed during a heating process as shown in FIG. 2D. Further, a phospho-silicate glass (PSG) film 5c is formed on the insulating film 5b by the CVD method as illustrated in FIG. 2E.

Next after effecting various heating processes, openings for leading out electrodes are formed in the PSG film 5c and insulating film 5b, and then an aluminum electrode 9 is deposited and etched. In this manner there is obtained the DSA MOS FET having a source-drain breakdown voltage $V_{DSS}$ of about 200 to 600 volts and the construction shown in FIG. 2F. It should be noted that the double insulating films 5b and 5c are denoted by the single insulating film 5d in FIG. 1B.

In general, in the MOS FET since no accumulation of minor carriers occurs, it is possible to obtain a high switching speed, and further since the drain current has a negative temperature coefficient, it is possible to achieve a high thermal stability. These properties are particularly suitable for the high power semiconductor device. However, as compared with the bipolar transistor, the MOS FET is a majority carrier device, and thus the necessary conditions for the high breakdown property and those for high power conflict with each other. That is to say, the substrate resistance necessary for obtaining a high breakdown voltage results in an increase of the saturation voltage, so that there is a drawback in that the so-called ON-resistance becomes higher if the chip area is the same. In order to solve such a problem, it is necessary to decrease the resistance of the power passage of the FET, particularly the drain current path thereof. In other words, it is very important to increase the efficiency of the surface area of the drain. To this end, it is absolutely necessary to find an optimum pattern design by utilizing the miniaturizing process technique. DSA MOS FET has been developed to satisfy the above requirement.

However, the pattern design of the known DSA MOS FET is not optimum. It is still required to develop a gate electrode pattern i.e. poly-silicon pattern and channel configuration in which the width of the current path, i.e. the channel width which is defined as the circumferential length of the channel region can be made as long as possible within a limited silicon chip surface area. If the channel width is lengthened, the drain current can be increased and the mutual conductance $g_m$ in a large current region can be made large. This results in a decrease of the ON-resistance. Therefore, it is most important to increase the channel width within a limited area.

In the known power MOS FET of high breakdown voltage used in, for example, a switching power source, the gate poly-silicon pattern has usually a rectangular grid-like configuration as illustrated in FIG. 1A. In such a pattern the distance $L_2$ between corners of obliquely aligned rectangular openings of the gate poly-silicon pattern is longer than the distance $L_1$ between opposing sides of adjacent openings by $\sqrt{2}$, i.e. $L_2=\sqrt{2}L_1$. In order to increase the channel width within a limited area, it is desired that the distances $L_1$ and $L_2$ be equal to each other. That is to say, since the channel region is situated along the edges of openings of the gate poly-silicon pattern, it is desired to satisfy the condition of $L_1=L_2$ in order to make the channel width as large as possible. In the known DSA MOS FET, since $L_1<L_2$, there are large unnecessary areas in the poly-silicon film pattern in accordance with a margin of $L_2-L_1$. This results in the gate area and thus the drain-gate capacitance being increased unnecessarily so that the switching speed is lowered.

It has been known that the channel width can be increased by miniaturizing the pattern. If the gate poly-silicon film pattern and source region are minimized, the channel width may be increased accordingly. However, in the known gate poly-silicon pattern having a rectangular grid-like configuration, the area of the opening for the source electrode is too large in comparison with the amount of drain current. If the number of channel regions is increased by the miniaturization, it is true that the channel width may be totally increased. However, the channel width within a single cell 10 becomes smaller. It should be noted that a cell is defined as a region in which the p type semiconductor layer 4 and n+ type semiconductor layer 8 are formed by using the opening in the poly-silicon film as the diffusion mask. That is to say, when the device is operated as a MOS FET under the same condition, in the device having the smaller channel width, the number of the openings for source electrode formed in the cell 10 becomes larger.

As is well known in the art, as compared with the bipolar transistor, the MOS FET is scarcely subject to thermal runaway, and the current density per cell region is smaller. Therefore, it is unnecessary to provide more than a minimum number of openings for the source electrode. It is therefore desired to design the pattern configuration in such a manner that many more channel regions can be formed by utilizing the unnecessary portions of the gate electrode and to increase the channel width.

It would be possible to increase the channel width and decrease the ON-resistance by miniaturizing the pattern. That is to say, the channel width may be increased by minimizing the surface area of the opening through which the source n+ type semiconductor layer 8 and p+ type semiconductor layer 3 connected electrically to the channel p type semiconductor layer 4 are connected to the source electrode. However, this measure has a limitation. In other words, the cell pattern could be miniaturized only to a limited extent. In the known DSA MOS FET the p type semiconductor layer 4 constituting the channel region is electrically connected to the p+ type semiconductor layer 3 and this latter layer 3 is electrically connected to the aluminum source electrode 9 together with the n+ type semiconductor layer 8 forming the source region. If the device is operated in the MOS mode without electrically connecting the p type semiconductor layer 4 to the n+ source region 8, carriers are injected from the n type semiconductor layer 2 into the p type semiconductor layer 4 and the current flows in the p type layer 4. Then the p type semiconductor layer 4 serves as the base region of the bipolar transistor and this affects the switching operation. This results in that there is a limitation in miniaturizing the source electrode lead-out portion defined by the opening formed in the gate poly-silicon film 6. Therefore, it is important to design a pattern configuration in which the surface area of the cell 10 can be made small and the channel width can be increased as far as possible.

One of the important properties of the semiconductor device is the switching speed. In order to attain a high switching speed, it is important to decrease the capacitance between the gate and drain. In order to achieve this, there have been developed typically two methods, i.e. increasing the thickness of the gate oxide film and decreasing the area occupied by the gate poly-silicon film pattern. However, in view of the threshold-voltage Vth and mutual conductance $g_m$ which define the MOS operational characteristics, there is a limitation in increasing the thickness of the gate oxide film. Therefore, the latter method, i.e. decreasing the area occupied by the poly-silicon film pattern is much more effective. This may be simply realized by thinning or miniaturizing the gate poly-silicon film pattern. However, if the poly-silicon film pattern is miniaturized, the resistance is increased accordingly and the switching speed becomes slow to an admissible extent.

Heretofore, the gate electrode has been usually formed by poly-silicon or metals having a high melting point such as molybdenum and tungsten. Since these gate materials can resist the high temperature processes, a multilayer construction has been adopted. Also in high power DSA MOS FET, the gate electrode is formed by a poly-silicon film and the aluminum source electrode is formed thereon via the insulating film so as to form the double layer electrode construction. Moreover, in order to obtain a long channel width, the gate poly-silicon film pattern has to be thinned and elongated to a large extent. As explained above, if the channel width is increased in order to decrease the ON-resistance, the gate resistance is increased and the switching speed becomes lower. Therefore, in the known DSA MOS FET, the gate resistance is decreased by providing a plurality of aluminum stripes having a high conductivity and connected to the gate poly-silicon film at the sacrifice of the channel regions. However, since between the gate aluminum electrodes there are formed the elongated poly-silicon gates having a length of several hundreds to several thousands microns, the gate resistance is still high.

Another known method for decreasing the gate resistance will be explained with reference to FIGS. 3A and 3B. In FIGS. 3A and 3B, portions similar to those shown in FIGS. 1A and 1B are denoted by the same reference numerals used in FIGS. 1A and 1B. In this known DSA MOS FET, gate and source electrode aluminum stripe patterns are provided alternately on the gate poly-silicon film via the insulating film so as to form a comb-shaped electrode configuration.

As illustrated in FIGS. 3A and 3B, the semiconductor device comprises an n+ type semiconductor substrate 1 and a first n type semiconductor layer 2 epitaxially grown on the substrate 1. A first insulating film 5a is formed on the semiconductor layer 2 and a poly-silicon film 6 is formed on the insulating film 5a. In the poly-silicon film 6 are formed openings in a grid-shape configuration. In the first semi-conductor layer 2 is formed a second p type semiconductor layer 4 in such a manner that a part of the layer 4 overlaps with a part of the poly-silicon film 6 via the first insulating film 5a. In the second layer 4 there is further formed a third n+ type semiconductor layer 8 in such a manner that a part of the third layer 8 overlaps with the poly-silicon film 6 via the first insulating film 5a. A second insulating film 5d is formed on the poly-silicon film 6 and its openings. On the second insulating film 5d are formed source and gate aluminum stripe electrodes 9a and 9b. The source electrode 9a is ohmic-contacted to the second and third semiconductor layers 4 and 8 through openings 10a formed in the second insulating film 5d and openings formed in the poly-silicon film 6. The gate electrode 9b is connected to the poly-silicon film 6 via openings 10b formed in the second insulating film 5d.

In the known DSA MOS FET shown in FIGS. 3A and 3B, having the comb-shaped electrode construction, the source Al electrode 9a and gate Al electrode 9b have to be separated from each other by a given distance by considering any lateral deviation of the patterns due to the isotropic etching for forming through-holes in the gate poly-silicon film 6 and recess between adjacent electrodes 9a and 9b. That is to say, the separation between adjacent electrodes 9a and 9b could not be effected stably due to the photo-lithography unless the pattern width of the gate poly-silicon film is thickened and the surface area of the cell is increased. In this manner, in the known DSA MOS FET there is a limitation in the miniaturization, so that the gate-source capacitance is large and the switching speed is low. As explained above, the gate resistance may be decreased to some extent by increasing the thickness of the gate poly-silicon film 6. However, then the source and gate Al electrodes 9a and 9b are liable to be cut with steep and deep steps on edges of openings formed in the poly-silicon film 6.

SUMMARY OF THE INVENTION

The present invention has for its object to provide a novel and useful semiconductor device in which an optimum gate pattern can be adopted and the channel width can be made large, so that the ON-resistance can be reduced, the mutual conductance $g_m$ can be increased and the switching speed can be made high.

It is another object of the invention to provide a semiconductor device in which the surface area of a cell can be minimized and the gate resistance can be decreased.

It is still another object of the invention to provide a semiconductor device in which the area of a chip can be minimized, while the producibility can be improved.

According to the invention, a semiconductor device comprises a first semiconductor layer having one conductivity type and including a major surface;

a first insulating layer applied on the major surface of the first semiconductor layer;

a semiconductive or conductive film pattern applied on the first insulating film;

a second semiconductor layer having the other conductivity type and formed in the major surface of the first semiconductor layer such that the second semiconductor layer is partially overlapped with the semiconductive or conductive film via the first insulating film;

a third semiconductor layer having one conductivity type and formed in the major surface of the first semiconductor layer within the second semiconductor layer such that the third semiconductor layer is partially overlapped with the semiconductive or conductive film via the first insulating film;

a second insulating film formed on the semiconductive or conductive film and a part of the third semiconductor layer;

a first metal electrode film applied on the second insulating film and connected at least to the third semiconductor layer through one or more openings formed in the second insulating film; and a second metal electrode film provided on the second insulating film and connected to said semiconductive or conductive film through one or more openings formed in the second insulating layer; whereby said second semiconductor layer surrounded by the semiconductive or conductive film pattern has at least one enlarged portion and at least one elongated portion connected to said enlarged portion.

BRIEF DESCRIPTION OF THE DRAWINGS

FIGS. 1A and 1B are plan and cross sectional views, respectively showing a known semiconductor device;

FIGS. 4A and 4B are plan and cross sectional views, respectively showing an embodiment of the semiconductor device according to the invention;

FIGS. 5, 6 and 7 are plan views illustrating modifications of the embodiment shown in FIGS. 4A and 4B;

FIGS. 8A and 8B are plan and cross sectional views, respectively showing another embodiment of the semiconductor device according to the invention;

FIGS. 9A and 9B are plan and cross sectional views, respectively depicting another embodiment of the semiconductor device according to the invention;

FIGS. 10, 11 and 12 are plan views depicting modifications of the embodiment illustrated in FIGS. 8A and 8B;

FIGS. 13A to 13E are cross sectional views showing successive steps of a method of manufacturing the semiconductor device shown in FIG. 10;

FIGS. 14A and 14B are plan and cross sectional views, respecitvely showing another embodiment of the semiconductor device according to the invention; and FIGS. 15A and 15B are plan and cross sectional views, respectively illustrating still another embodiment of the semiconductor device according to the invention.

DESCRIPTION OF THE PREFERRED EMBODIMENTS

Figure 2A:
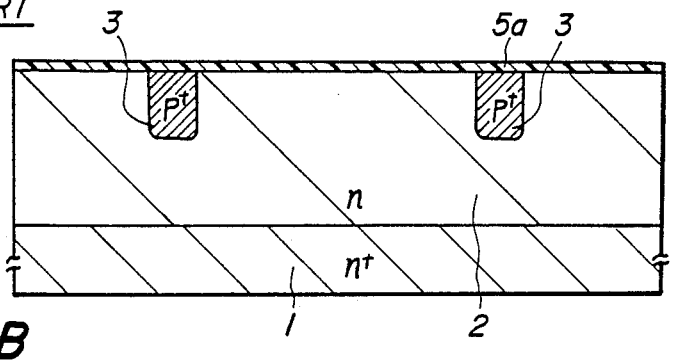
FIGS. 2A to 2F are cross sectional views depicting successive steps of a method of manufacturing the known semiconductor device shown in FIGS. 1A and 1B.
Figure 2B:
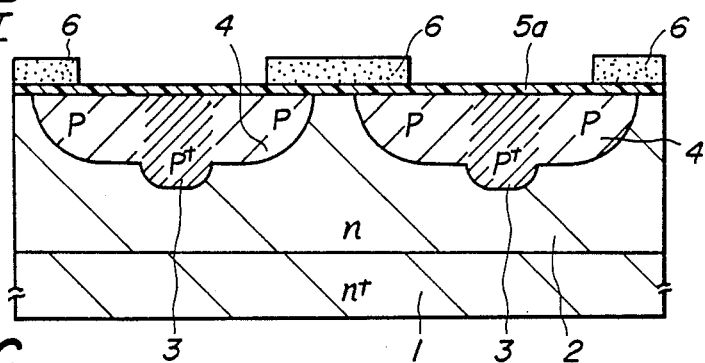
Figure 2C:
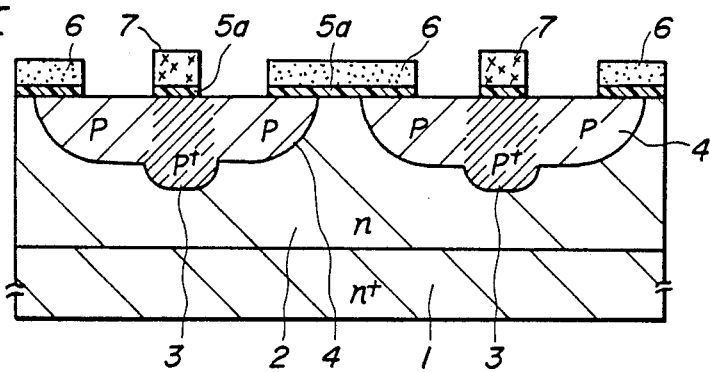
Figure 2D:
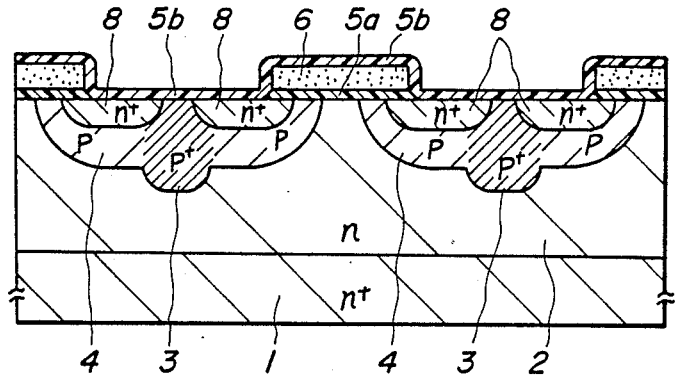
Figure 2E:
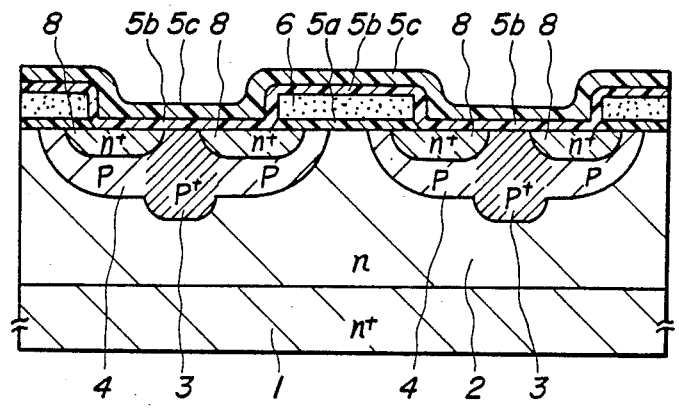
Figure 2F:
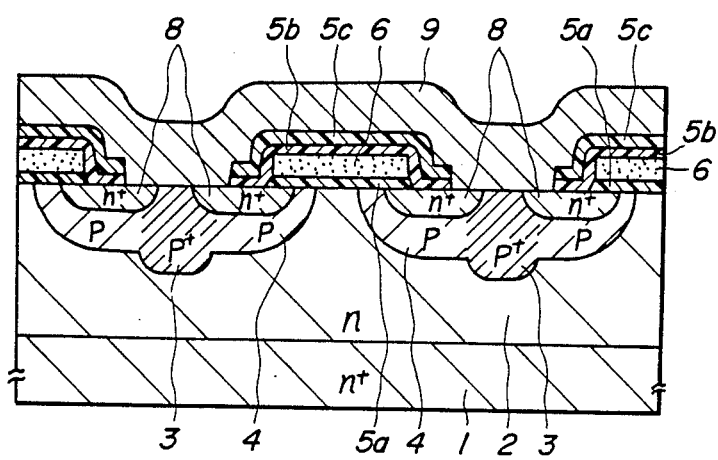

FIG. 4A is a plan view showing an embodiment of the semiconductor device according to the invention, and FIG. 4B is a cross sectional view cut along a line A—A' in FIG. 4A. In FIG. 4A, an aluminum source electrode is omitted for the sake of simplicity. The semiconductor device of the present embodiment is formed as a DSA MOS FET.

The semiconductor device comprises an n+ type semiconductor, e.g. silicon substrate 11, an n type epitaxially grown silicon layer (first semiconductor layer) 12 formed on the substrate 11, an insulating oxide film (first insulating film) 15a formed on a major surface of the first semiconductor layer 12, and a poly-silicon film 16 formed on the first insulating film 15a. The n+ type substrate 11 and n type layer 12 form an n-on-n+ semiconductor body. The poly-silicon film 16 is etched according to a given gate electrode pattern. It should be noted that according to the invention the gate electrode may be formed not only by poly-silicon, but also by conductive metals having a high melting point such as molybdenum, nickel, chromium, and tungsten or metal silicides having a high melting point such as molybdenum silicide, nickel silicide, titanium silicide. The semiconductor device further comprises a p type semiconductor layer (second semiconductor layer) 14 formed in a surface of the first n type semiconductor layer 12 in such a manner that a part of the second semiconductor layer 14 overlaps with a part of the poly-silicon film 16 via the first insulating film 15a. In the second semiconductor layer 14 is further formed an n+ type semiconductor layer (third semiconductor layer) 18 in such a manner that the layer 18 overlaps partially with the poly-silicon film 16 via the first insulating film 15a. The semiconductor device further comprises an insulating film (second insulating film) 15d formed on the poly-silicon film 16 and first semiconductor layer 12. In the second insulating film 15d there are formed openings 21, and an aluminum electrode film (metal electrode film) 19 is formed on the second insulating film 15d in such a manner that the metal electrode film 19 is ohmic-connected to the second semiconductor layer 14 via a p+ type semiconductor layer 13 as well as to the third semiconductor layer 18.

As illustrated in FIG. 4A, the surface pattern of the second semiconductor layer 14 formed in the first semiconductor layer 12 has an interdigital array of a plurality of unit patterns each of which includes three enlarged portions 14A, 14B and 14C having octagonal shapes and two elongated bridge portions 14D and 14E which connect adjacent enlarged portions at opposing sides thereof to each other. In FIG. 4A, the contour of the p type semiconductor layer 14 is illustrated by a chain line. As shown in FIG. 4A, the bridge portions 14D and 14E are thinner than the enlarged portions 14A, 14B and 14C. In FIGS. 4A and 4B, openings formed in the poly-silicon film 16 and defining cells are denoted by a reference numeral 20, and openings formed in the second insulating film 15d are denoted by a reference numeral 21. The distance $L_2$ between corners of obliquely aligned cells 20 is substantially equal to the distance $L_1$ between opposing sides of adjacent cells, i.e. $L_1 \cong L_2$.

Figure 5:
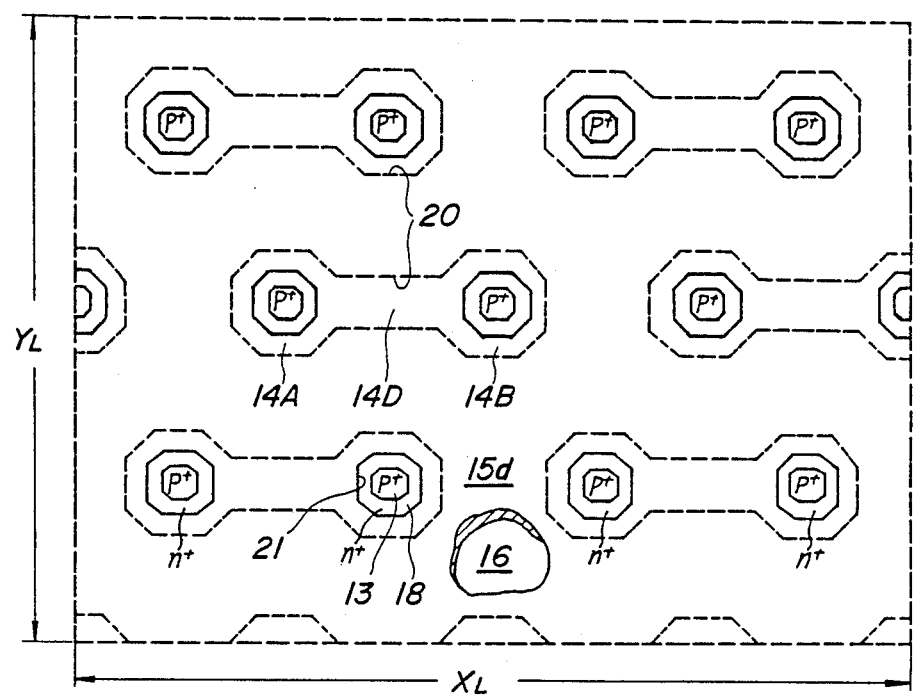

FIGS. 5 to 7 are plan views showing other embodiments of DSA MOS FET according to the invention. In these embodiments portions similar to those shown in FIG. 4A are represented by the same reference numerals used in FIG. 4A.

In an embodiment illustrated in FIG. 5, a unit pattern forming a cell 20 comprises two enlarged portions 14A and 14B having octagonal shapes and a single elongated bridge portion 14D for connecting the enlarged portions to each other.

In an embodiment shown in FIG. 6, a unit pattern of cell 20 comprises two enlarged portions 14F and 14G having hexagonal shapes which are coupled with each other by an elongated bridge portion 14H.

In an embodiment depicted in FIG. 7, a unit pattern of a cell 20 includes two enlarged portions 14I and 14J having rectangular shapes and a single elongated bridge portion 14K coupling the enlarged portions with each other.

In each of the embodiments shown in FIGS. 4A, 4B and 5 to 7, a number of unit patterns are arranged interdigitally such that the distances $L_1$ and $L_2$ become substantially equal to each other. Therefore, the total length of the edges of the openings 20 formed in the poly-silicon film 16 can be made very long and therefore the width of the channel region can be increased materially.

Now various dimensions of the semiconductor device according to the invention will be explained in comparison with those of the known semiconductor device illustrated in FIGS. 1A and 1B. For the sake of simplicity, it is assumed that the same design rule is adopted in both semiconductor devices and vertical and horizontal lengths $Y_L$ and $X_L$ are set to 120 $\mu$m and 160 $\mu$m, respectively.

In the known device shown in FIG. 1A there are formed twelve source electrode lead-out openings, i.e. cells 10, and in each cell, the length $L_{01} = L_{02}$ of each side is equal to 20 $\mu$m. Therefore, in each cell there is formed a channel width of 80 $\mu$m and thus a total channel width within a range encircled by the broken line is 960 $\mu$m (80×12).

Contrary to this, in the semiconductor device according to the invention shown in FIG. 4A, the length $L_{03}$ of each vertical and horizontal side of the octagonal enlarged portions 14A, 14B, 14C is 10 $\mu$m, and the length $L_{04}$ of respective sides inclined by 45° is about 7 $\mu$m ($= \sqrt{2}/2 \cdot L_{03}$). The length $L_{05}$ of each side of the bridge portions 14D, 14E is 20 $\mu$m. Therefore, the channel width within a unit cell 20 amounts to about 244 $\mu$m and the total channel width within a region surrounded by a broken line is about 1,132 $\mu$m. In the embodiment illustrated in FIG. 6, $L_{06} = 20$ $\mu$m, $L_{07} = 15$ $\mu$m, $L_{08} \cong 7$ $\mu$m, $L_{09} = 60$ $\mu$m, and the total channel width within a region encircled by a broken line is about 1,118 $\mu$m. In the embodiment shown in FIG. 7, the total channel width is equal to about 1,080 $\mu$m, because $L_{10} = 20$ $\mu$m, $L_{11} = 20$ $\mu$m, $L_{12} = 5$ $\mu$m and $L_{13} = 100$ $\mu$m. As explained above, according to the present invention, the channel width can be made larger than the known semiconductor device, and the difference therebetween becomes much larger, if the number of cells is increased or the area of the chip is increased.

As explained above, according to the invention, the channel width can be increased materially. This is due to the fact that the distances $L_1$ and $L_2$ can be made substantially equal to each other by effectively using the oblique sides in the cell pattern. Further, according to the invention, the cells are arranged in an interdigital manner, and thus the cell array may be concentrated toward the center of the chip so that the greater number of cells may be formed in the chip accordingly.

In case of miniaturizing the pattern, particularly the gate poly-silicon pattern, in the known semiconductor device it is necessary to separate adjacent source electrode lead-out openings by several microns. That is to say, in the known device, the source electrode lead-out openings are disadvantageously limited by the design rule. According to the present invention, the distance between adjacent source electrode lead-out openings can be designed at will as explained above with reference to the embodiments shown in FIGS. 4 to 7, while the channel width can be advantageously increased.

In general, the longer the channel width that is obtained, the smaller the area of the source region is. Therefore, upon using the same design rule, in the known device shown in FIG. 1A there are formed twelve cells within the region enclosed by the broken line, but in the embodiments according to the invention shown in FIGS. 6 and 7 there are formed seven and six cells, respectively, while the total channel width is 1,118 µm and 1,080 µm, respectively.

According to the invention, it is possible to provide the optimum gate poly-silicon pattern, i.e. a cell pattern for obtaining the large channel width within a limited chip area. Therefore, by suitably arranging the source electrode lead-out openings in the gate poly-silicon film, it is possible to obtain a large drain current. Moreover, the mutual conductance $g_m$ in the large current region can be increased, so that the switching speed can be made higher and the ON-resistance can be made lower. Further, according to the invention, the surface area of the chip can be reduced and the semiconductor device can be manufactured stably and reliably.

In the embodiments of DSA MOS FET according to the invention illustrated in FIGS. 4A, 4B and 5 to 7, the source electrode 19 is connected to both the n+ type source semiconductor layer 18 and p type channel layer 14 via the p+ type semiconductor layer 13 in respective cells 20. It should be noted that the p+ type semiconductor layer 13 is not always necessary, but may be omitted. At any rate, the source electrode 19 is ohmic-contacted with both the n+ and p type semiconductor layers 18 and 14 within the opening 21 formed in the second insulating film 15d within the opening 20 of the gate poly-silicon film 16. Therefore, the dimension of the cell opening 20 could not be minimized to the full extent. According to another aspect of the invention, such a disadvantage can be mitigated. This will be explained next.

FIGS. 8A and 8B are plan and cross sectional views, respectively showing another embodiment of a DSA MOS FET according to the invention in which the source electrode lead-out openings can be minimized and the channel width can be made longer. In the present embodiment, portions similar to those shown in FIGS. 4A and 4B are represented by the same reference numerals used in FIGS. 4A and 4B and their detailed explanation is omitted. In the present embodiment, the p type semiconductor layer 14 and thus the gate poly-silicon film 16 have three enlarged portions 14A, 14B and 14C having octagonal shapes and two elongated bridge portions 14D and 14E connecting the enlarged portions to each other at their opposing sides. The dimension of the middle enlarged portion 14B is smaller than the outer enlarged portions 14A and 14C. In the enlarged portions 14A and 14C there is exposed through the openings 21a formed in the second insulating film 15d only the p+ type semiconductor layer 13 connected electrically to the p type semiconductor layer 14. In the central enlarged portion 14B, the n+ type semiconductor layer 18 is exposed through openings 21b formed in the second insulating film 15d. The source aluminum electrode film 19 is connected to the p type semiconductor layer 14, i.e. channel region through the openings 21a formed in the enlarged portions 14A and 14C, and at the same time is connected to the n+ type semiconductor layer 18, i.e. source region through the openings 21b formed in the central enlarged portions 14B. Therefore, the p type semiconductor layer 14 and n+ type semiconductor layer 18 are electrically connected to each other by means of the source electrode film 19 made of aluminum having a good conductivity.

In the known semiconductor device illustrated in FIGS. 1A and 1B, the source electrode film is connected to both the source and channel regions through a single opening defining the cell. Therefore, the source electrode lead-out openings are limited by the design rule. In contrast therewith, in the semiconductor device according to the invention illustrated in FIGS. 8A and 8B, the source electrode 19 is connected to the source n+ type semiconductor layer 18 and channel p type semiconductor layer 14 via the independent openings 21b and 21a, respectively which are separated from each other by a given distance. Therefore, the cell configuration becomes elongated and the source electrode lead-out openings are no longer limited by the design rule. Further, also in the present embodiment, the channel width can be increased to a great extent similarly to the embodiments illustrated in FIGS. 4 to 7.

FIGS. 9A and 9B illustrate still another embodiment of a DSA MOS FET according to the invention which is similar to the embodiment shown in FIGS. 8A and 8B. In the present embodiment the pattern of the p type semiconductor layer, i.e. the cell pattern comprises three enlarged portions 14A, 14B and 14C and two elongated bridge portions 14D and 14E connecting the enlarged portions to each other. Within enlarged portions 14A, 14B and 14C, openings 21a, 21b and 21c are formed in the second insulating film 15d. As clearly shown in FIG. 9B, the source electrode aluminum film 19 is connected to the p+ type semiconductor layer 13 (which is electrically connected to the p type source semiconductor layer 14) through the opening 21a, and at the same time is connected to the n+ type semiconductor layer (source region) 18 through the openings 21b and 21c.

It should be noted that in the modified embodiment of a DSA MOS FET having the cell pattern including first, second and third enlarged portions, the source electrode film may be connected to the n+ type semiconductor layer within the first and second enlarged portions and to the p+ type semiconductor layer within the second enlarged portion or the source electrode film may be connected to the n+ type semiconductor layer within the first enlarged portion and at the same time to the p+ type semiconductor layer within the second and third enlarged portions.

Figure 10:
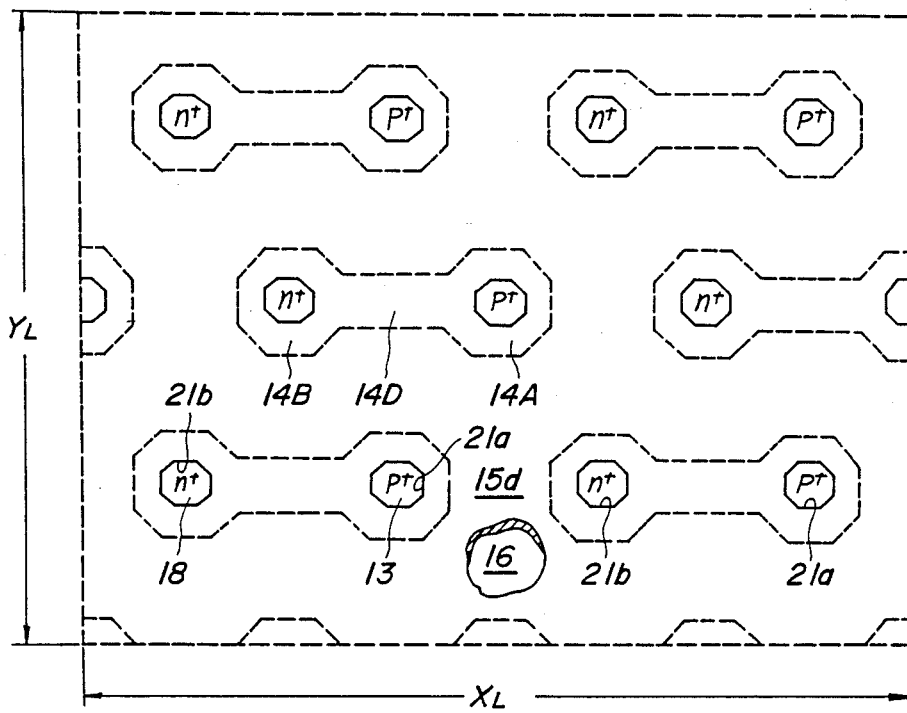

FIGS. 10 to 12 show still other embodiments of a DSA MOS FET according to the invention in which the pattern of cell 20 comprises two enlarged portions 14A and 14B and a single elongated bridge portion 14D coupling the enlarged portions with each other. In the embodiment illustrated in FIG. 10, the enlarged portions 14A and 14B have octagonal shape and the source electrode film not shown is connected to the p+ type semiconductor layer 13 through the opening 21a formed in the second insulating film 15d within the first enlarged portion 14A and at the same time is connected to the n+ type semiconductor layer 18 through the opening 21b formed in the second insulating film 15d within the second enlarged portion 14B. A number of cell patterns 20 are arranged in an interdigital manner so that distances between adjacent cells become substantially equal to each other. That is to say, the distance L₁ and L₂ are substantially equal to each other. In the embodiment depicted in FIG. 11, the cell pattern is formed by two enlarged portions 14A and 14B having irregular hexagonal shapes and an elongated bridge portion 14D connecting the enlarged portions to each other. In the embodiment illustrated in FiG. 12, the cell pattern is composed of two rectangular enlarged portions 14A and 14B and an elongated bridge portion 14D for coupling the enlarged portions with each other. Also in the embodiments shown in FIGS. 10 and 11, the source electrode film not shown is connected on one hand to the p+ type semiconductor layer 13 through the opening 21a formed in the second insulating film 15d within the first enlarged portion 14A and on the other hand to the n+ type semiconductor layer 18 through the opening 21b within the second enlarged portion 14B.

In the embodiments shown in FIGS. 8 to 12, the opening 21a formed in the second insulating film 15d is accurately aligned with the edge pattern of n+ type semiconductor layer 18 within the first enlarged portion 14A. When the pattern is minimized to such a greater extent that no or substantially no allowance in position alignment is obtained, the opening 21a might be deviated from the contour of the n+ type semiconductor layer 18. In such a case, the source electrode film is connected not only to the p+ type semiconductor layer 13, but also to the n+ type semiconductor layer 18. However, this does not affect the property of the semiconductor device.

Now the method of manufacturing the semiconductor device illustrated in FIG. 10 will be explained with reference to FIGS. 13A to 13E.

Figure 13A:
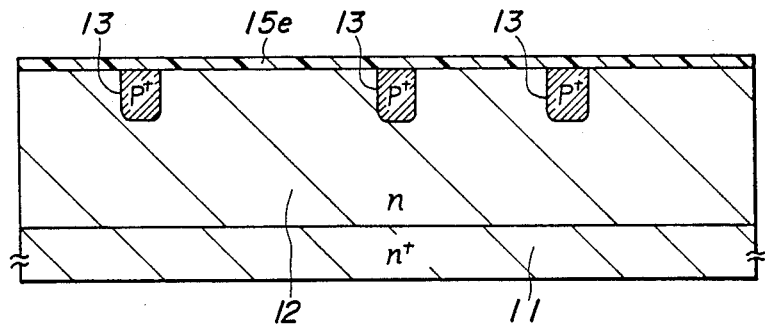

On an n+ type semiconductor silicon substrate 11 is epitaxially grown an n type semiconductor silicon layer 12 and a silicon oxide film 15e having a thickness of about 1,000 Å is formed on a surface of the n type semiconductor layer 12. Then, a p+ type semiconductor layer 13 is selectively formed in the n type semiconductor layer 12 by means of photoetching and ion implantation techniques as illustrated in FIG. 13A.

Figure 13B:
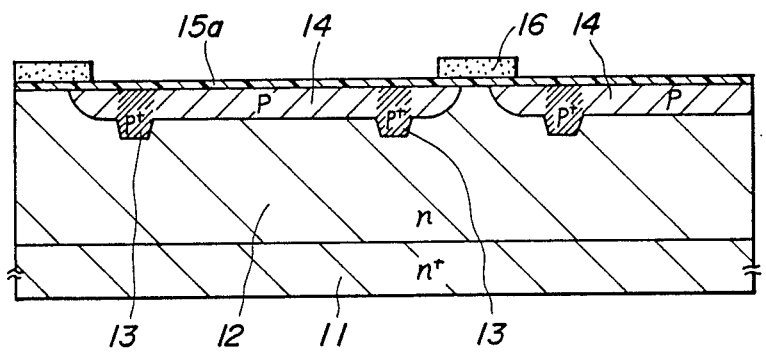

Next the silicon oxide film 15e is removed by etching and a gate oxide film 15a having a thickness of about 1,000 Å is formed on the n type semiconductor layer 12. Then a poly-silicon film having a thickness of about 6,000 Å is deposited on the gate insulating film 15a after which it is selectively etched into a given pattern to form a gate poly-silicon film 16. After that, p type impurities are ion-injected into the n type semiconductor layer 12 while the poly-silicon film 16 is used as the mask, and the assembly is subjected to a heating treatment to form a p type semiconductor layer 14 forming a channel region as shown in FIG. 13B.

Figure 13C:
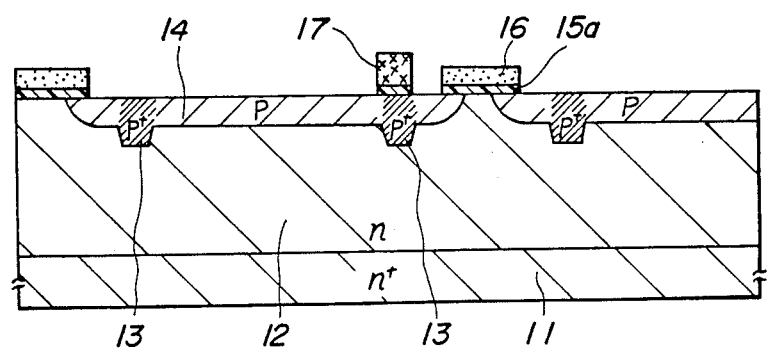

Next, as illustrated in FIG. 13C, a photoresist film 17 is selectively formed on the silicon oxide film 15a and the silicon oxide film is then selectively etched. Then a large amount of n type impurities is ion-injected into the p type semiconductor layer 14 and the assembly is heated to form a silicon oxide film 15f. Then a phospho-silicate glass film 15g is deposited on the silicon oxide film 15f. In the embodiments so far explained, these silicon oxide film 15f and phospho-silicate glass film 15g are denoted as the second insulating film 15d. In this manner the n+ type semiconductor layer 18 is selectively formed in the p type semiconductor layer 14 as illustrated in FIG. 13D. As explained above, in a DSA MOS FET, the p type channel region 14 and n+ type source region 18 are self-aligned, because these regions are formed by using the same mask made of the gate poly-silicon film 16.

Next, openings 21a and 21b for connecting the source electrode to the p+ type semiconductor layer 13 and n+ type semiconductor layer 18, respectively are formed in the insulating films 15f, 15g and an aluminum source electrode film 19 is formed on the insulating film 15g as shown in FiG. 13E to complete the final DSA MOS FET. It should be noted that the gate poly-silicon film 16 is connected to a gate electrode film through openings formed in the insulating layers 15f, 15g. In practice, a passivation film made of phospho-silicate glass is applied on the electrode films.

Also in the embodiments shown in FIGS. 8A, 8B and 9 to 12, the channel width can be increased and the current per unit area can be made large as compared with the known semiconductor device, because the cell pattern is composed of the enlarged portion having polygonal shape and one or more elongated portions connecting the enlarged portions to each other. Further the area of the gate oxide film 15a occupied by the gate poly-silicon film 16 is smaller than the known device. In the known semiconductor device shown in FIGS. 1A and 1B, the area of the gate poly-silicon film 6 is 14,400 $\mu m^2$, whereas in the embodiment of the present invention shown in FIG. 10, the area of the gate poly-silicon film 16 amounts to 13,200 $\mu m^2$. Therefore, according to the present invention the capacitance between the gate and drain can be made small and thus the switching speed can be made high.

In order to improve the property of the semiconductor device it is advantageous to increase the channel width by reducing the surface area of the source electrode lead-out openings. In the known semiconductor device shown in FIG. 1A, both the n³⁰ type semiconductor layer 8 and p+ type semiconductor layer 3 are exposed in each opening. In the known device the area of a single opening is $12 \times 12$ $\mu m^2$ and the total area within the rectangular portion encircled by the broken line amounts to 1,728 $\mu m^2$.

In the semiconductor device according to the embodiments shown in FIGS. 8 to 13, the n+ type semiconductor layer 18 and p+ type semiconductor layer 13 are exposed at different openings 21b and 21a each having an area of $6 \times 6$ $\mu m^2$. Therefore the total area of the source electrode lead-out openings amounts to 528 $\mu m^2$ which is smaller than the total area of 1,728 $\mu m^2$ in the known semiconductor device. Therefore, according to the invention the cell patterns may be miniaturized to a greater extent and the number of cells formed in a unit chip area may be increased. This is particularly effective for prolonging the channel width.

FIGS. 14A and 14B are plan and cross sectional views, respectively showing still another embodiment of a DSA MOS FET according to the invention in which the gate wiring resistance can be made low by alternately arranging stripe-shaped gate and source electrode films, while the cell pattern can provide a remarkable increase in the channel width. Portions similar to those in the previous embodiments are denoted by the same reference numerals used in the previous embodiments.

The DSA MOS FET of the present embodiment comprises an n+ type silicon semiconductor substrate 11 an n type silicon semiconductor layer 12 epitaxially grown on the substrate 11, a first insulating silicon oxide film 15a formed on the n type silicon layer 12, and a gate poly-silicon film 16a formed on the first insulating silicon oxide film 15a in accordance with a given cell pattern. In the n type semiconductor layer 12 there is formed p+ and p type semiconductor layers 13 and 14. The p type semiconductor layer 14 is partially overlapped with the poly-silicon film 16a via the first insulating film 15a. In the p type semiconductor layer 14 is formed an n+ type semiconductor layer 18 which is partially overlapped with the poly-silicon film 16a via the first insulating film 15a. There is further provided a second insulating film 15d on the poly-silicon film 16a and exposed portions of the n type semiconductor layer 12. On the second insulating film 15d there are alternately formed source aluminum electrode stripes 19a and gate aluminum electrode stripes 19b. The source electrode stripe 19a is ohmic-connected to the p+ and n+ type semiconductor layers 13 and 18 through an opening 21a formed in the second insulating film 15d. Since the p+ type semiconductor layer 13 is directly connected to the p type semiconductor layer 14, the source electrode 19a is electrically connected to the p type semiconductor layer 14 forming the channel region. It should be noted that the p+ type semiconductor layer 13 may be dispensed with and then the source electrode 19a is directly ohmic-contacted with the p type semiconductor layer 14. The gate electrode 19b is connected to the gate poly-silicon film 16a via openings 21c formed in the second insulating film 15d at positions directly above the poly-silicon film.

In the present embodiment, the gate poly-silicon film is composed of a continuous portion 16a which forms a grid-like pattern and independent portions 16b which constitutes islands within spaces formed in the continuous portion. The cell pattern formed by the continuous and independent portions 16a and 16b includes a ring portion 22A surrounding the independent portion 16b, two end portions 22B and 22C arranged symmetrically with respect to the ring portion 22A, and two bridge portions 22D and 22E for coupling the end portions to the ring portion. The end portions 22B, 22C have the contour configuration of a polygon having sides the number of which is a multiple of two, e.g. of rectangular shape, and the ring portion 22A has also a polygonal shape having sides whose number is a multiple of two, e.g. a rectangular shape. The contour configuration of the end and ring portions is not limited to the rectangular shape, but may be of hexagonal, or octagonal shape. Further, the end and ring portions may be formed into a circular shape.

As shown in FIG. 14A, a number of cells are arranged in such a manner that the ring portions 22A of the cell pattern are aligned in one direction, i.e. the vertical direction in FIG. 14A. Further, the cells are arranged in an interdigital manner such that the ring portions 22A of cells aligned in a row are shifted from the ring portions 22A of cells aligned in adjacent rows by a half pitch. Thus, between the end portions 22B and 22C of cells aligned in a row are situated successive end portions 22C and 22B of adjacent rows. Therefore, the distances between each of the end portions 22B and 22C and adjacent ring portions, end portions, and bridge portions become substantially equal to each other, and therefore the channel width within a limited area of the chip can be increased.

The gate electrode 19b is connected to the independent portions 16b of the gate poly-silicon film through openings 21b formed in the second insulating film 15d and at the same time is connected to the continuous portion 16a of the gate poly-silicon film through openings 21c formed in the second insulating film 15d. That is to say, the continuous portion 16a and independent portion 16b of the gate poly-silicon film are mutually connected by means of the gate aluminum electrode 19b having good conductivity. The stripe-shaped source electrode 19a and gate electrode 19b are alternately arranged, while spaces of ten to thirty microns are formed between adjacent stripe-shaped electrodes. The width of the source electrode 19a is wider than that of the gate electrode 19b.

In the present embodiment, the poly-silicon film pattern is formed by the mesh-like continuous portion 16a and island-like independent portion 16b, so that the channel width is increased to a greater extent. That is to say, in the gate electrode construction according to the present embodiment, each of the independent portions 16b is arranged in respective ring portions 22A and these portions are connected to each other by means of the gate electrode film 19b having high conductivity. In the source electrode construction, the source electrode film 19a is connected to the p+ type semiconductor layer 13 and n+ type semiconductor layer 18 within the end portions 22B and 22C of the cell pattern. The source and gate electrode stripes 16a and 16b are alternately extended in parallel with each other in a comb-shape.

FIGS. 15A and 15B are plan and cross sectional views, respectively illustrating still another embodiment of a DSA MOS FET according to the invention similar to the embodiment shown in FIGS. 14A and 14B. In FIG. 15A, all stripe-shaped electrodes are omitted for the sake of clearness. In the present embodiment, the width of the gate poly-silicon film pattern can be made substantially constant by forming the cell pattern with inclined lines, so that the channel width can be further increased. In the present embodiment, the cell pattern defined by the poly-silicon film pattern 16a and 16b includes a ring portion 22A having a substantially diamond shape, end portions 22B and 22C arranged symmetrically with respect to the ring portion 22A and having substantially octagonal shape and elongated thin bridge portions 22D and 22E connecting the end portions to the ring portion. The remaining construction of the present embodiment is similar to that of the previous embodiment shown in FIGS. 14A and 14B and therefore is not explained further.

In the embodiments shown in FIGS. 14A, 14B and 15A, 15B, the gate wiring resistance (gate resistance) can be reduced by specially designing the gate poly-silicon film pattern and the gate and source electrode film pattern and further the ON-resistance can be decreased by increasing the channel width. Now the channel width of these embodiments will be compared with the known semiconductor device having the construction illustrated in FIGS. 1A and 1B. It is assumed the same design rule is adopted and the comparison is effected for a limited chip area of $127 \times 127$ $\mu m^2$ (this area is denoted by broken lines in FIGS. 14A and 14B). In the known device, within said area there are provided twenty five cells each having a channel width of 56 $\mu m$ and therefore, a total channel width is equal to 1,400 $\mu m$. In the embodiment illustrated in FIGS. 14A and 14B, the channel width per cell is 414 $\mu m$ and the total channel width becomes 1,852 $\mu m$, and in the embodiment shown in FIG. 15A the channel width per cell is 292 $\mu m$ and the total channel width amounts to 1,930.8 $\mu m$. In practice, in high power semiconductor devices since a very large number of cells are formed in a chip, the difference in the channel width between the known device and the device according to the present invention becomes much larger.

Figure 3A:
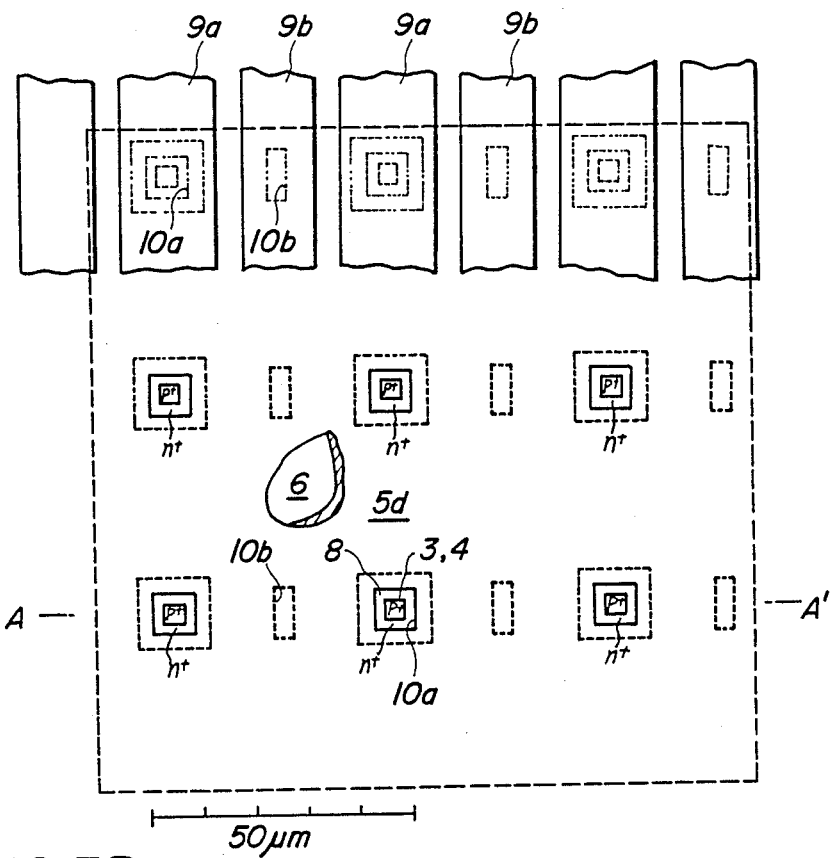
FIGS. 3A and 3B are plan and cross sectional views, respectively illustrating another known semiconductor device.
Figure 3B:
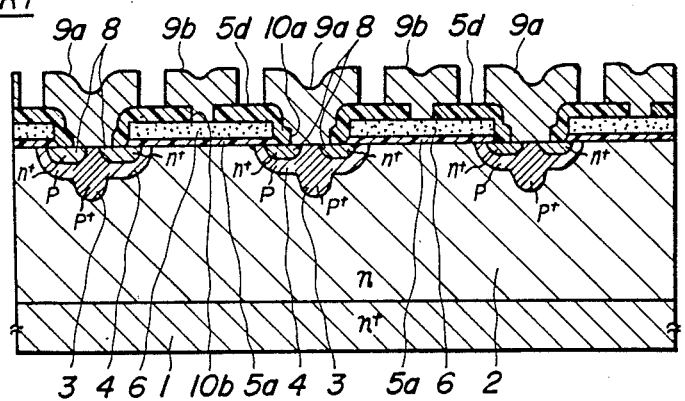

In case of miniaturizing the cell pattern, in the known device the source electrode lead-out openings should be separated by several microns because a single source electrode lead-out opening is formed in each cell. Therefore, the physical arrangement of source electrode lead-out openings is disadvantageously limited by the design rule. According to the invention, since the source electrode lead-out openings are separated from each other by a substantial distance, the cell pattern becomes elongated and the physical arrangement of source electrode lead-out openings is no more limited by the design rule. Moreover, according to the invention, since the cell pattern is composed of the enlarged portions of polygonal shape having the number of sides equal to a multiple of two and of the elongated bridge portions for connecting the enlarged portions to each other, the stripe-shaped source and gate electrode films can be separated by any desired distance without decreasing the channel width. In the known semiconductor device having the comb-shaped electrode construction shown in FIG. 3A, the channel width per cell is 56 μm and the total channel width amounts only to 504 μm which is substantially smaller than the total channel width of the embodiments illustrated in FIGS. 14A and 15A. Therefore, according to the invention, the mutual conductance $g_m$ within a large current region can be increased to decrease the ON resistance and further the gate wiring resistance can be decreased. This is particularly advantageous for a semiconductor device having a large chip area and is indispensable for attaining high switching speed. Moreover, since the gate poly-silicon film is not necessarily thickened, the source and gate electrodes are hardly cut or broken at the edges of the gate poly-silicon film. In this manner, it is possible to provide an MIS type semiconductor device having superior properties and smaller chip area and further the semiconductor device can be manufactured stably and reliably.

The present invention is not limited to the embodiments explained above, but various modifications and alternations may be conceived by those skilled in the art within the scope of the invention.

In all the above mentioned embodiments, the source electrode film is electrically connected to the p type semiconductor layer 14 (channel region) via the p+ type semiconductor layer 13, but since the p+ type semiconductor layer serves merely as the contact region, it may be omitted. In such a case the source electrode will be directly contacted with the p type semiconductor layer 14.

In the embodiments so far explained, the gate electrode is formed by poly-silicon, but it may be formed by metals having a high melting point such as Mo, Ni, Ti, Cr and metal silicides having a high melting point such as molybdenum silicide, titanium silicide, nickel silicide, platinum silicide. Further, amorphous silicon may be used instead of poly-silicon.

Further, the p and n conductivity types of the various semiconductor regions may be reversed.

Moreover, in the above embodiments the cell pattern is formed by two or three enlarged portions connected to each other by one or two elongated bridge portions. However, it is apparent that the number of enlarged portions and bridge portions may be one or more than three.

It should be noted that the semiconductor devices explained above are DSA MOS FET, but the semiconductor device according to the invention may be constructed in the form of V-groove or U-groove MOS FET. In such a case a V- or U-groove is formed in the poly-silicon film or its edge portion to form the channel region. Further, the semiconductor device according to the invention may be formed as a bipolar type semiconductor device in which an emitter is formed by the poly-silicon film pattern and a base is formed by the cell pattern or the emitter is formed by the cell pattern and the base is constructed by the poly-silicon pattern.

Further, the semiconductor device according to the invention may be formed as a high frequency transistor or power switching transistor.

What is claimed is:

1. A semiconductor device comprising
a first semiconductor layer having one conductivity type and including a major surface;
a first insulating layer applied on the major surface of said first semiconductor layer;
a second semiconductor layer having a conductivity type opposite to said one conductivity type, said second semiconductor layer being located within the major surface of said first semiconductor layer and forming a plurality of mutually spaced parallel unit cells each having one of first and second surface patterns, said first pattern consisting of two enlarged portions interconnected by an elongated portion and said second pattern consisting of first, second and third enlarged portions and first and second elongated portions, said first and second enlarged portion being connected to each other by said first elongated portion and said second and third enlarged portions being connected to each other by said second elongated portion, the enlarged and elongated portions of said unit cells being interdigitally arranged on said first semiconductor layer such that the distances between the corners of adjacent obliquely aligned cells are substantially equal to the distances between opposing sides of adjacent cells;
a gate electrode film applied on said first insulating layer and having a plurality of openings whose contour configuration corresponds to a pattern of said unit cells, said gate electrode film being formed of a material selected from the group consisting of semiconductive and conductive materials;
a third semiconductor layer having said one conductivity type, said third semiconductor layer being formed in the major surface of said first semiconductor layer within said second semiconductor layer, said first insulating film being interposed between said gate electrode film and each of said second and third semiconductor layers;
a second insulating layer formed on said gate electrode film and a part of said third semiconductor layer; and
a metal electrode film applied on said second insulating layer, said metal electrode film being connected to at least said third semiconductor layer through a plurality of openings formed in said second insulating layer at the enlarged portions of said second semiconductor layer.

2. A semiconductor device according to claim 1, wherein said enlarged portions are each in the shape of a polygon having an even number of sides.

3. A semiconductor device according to claim 2, wherein said enlarged portions have a rectangular shape.

4. A semiconductor device according to claim 2, wherein said enlarged portions have an hexagonal shape.

5. A semiconductor device according to claim 2, wherein said enlarged portions have an octagonal shape.

6. A semiconductor device according to claim 5, wherein said metal electrode film is connected to both said second and third semiconductor layers at said enlarged portions.

7. A semiconductor device according to claim 1, wherein said metal electrode film is connected to said second semiconductor layer at at least one enlarged portion and to said third semiconductor layer at at least one other of said enlarged portions.

8. A semiconductor device comprising
a first semiconductor layer having one conductivity type and including a major surface;
a first insulating layer applied on the major surface of said first semiconductor layer;
a second semiconductor layer having a conductivity type opposite to said one conductivity type, said second semiconductor layer being located within the major surface of said first semiconductor layer and forming a plurality of mutually spaced parallel unit cells each having at least two enlarged portions and at least one elongated portion interconnecting said enlarged portions, the enlarged and elongated portions of said unit cells being interdigitally arranged in said first semiconductor layer in a pattern such that the distances between the corners of adjacent obliquely aligned cells are substantially equal to the distances between opposing sides of adjacent cells;
a gate electrode film applied on said first insulating layer and including a continuous portion having a plurality of openings whose contour configuration corresponds to the pattern of said unit cells and a pluraltiiy of independent portions each situated within the openings of said continuous portion, said gate electrode film being formed of a material selected from the group consisting of semiconductive and conductive materials;
a third semiconductor layer having said one conductivity type, said third semiconductor layer being formed in the major surface of said first semiconductor layer within said second semiconductor layer, said first insulating layer being interposed between said gate electrode film and each of said second and third semiconductor layers;
a second insulating layer formed on said gate electrode film and a part of said third semiconductor layer;
a plurality of first metal electrode films applied on said second insulating layer, said first metal electrode films being connected to at least said third semiconductor layer through a plurality of openings formed in said second insulating layer at the enlarged portions of said second semiconductor layer; and
a plurality of second metal electrode films applied on said second insulating layer such that said second metal electrode films are interposed between adjacent first metal electrode films, said second metal electrode films being connected to said continuous portions and independent portions of the gate electrode film through a plurality of openings formed in said second insulating layer.

9. A semiconductor device according to claim 8, wherein a plurality of unit cells each formed by three enlarged portions connected serially by two elongated portions are interdigitally arranged such that the elongated portions extend parallel with each other in a first direction, the distances between adjacent enlarged portions are substantially equal to each other, and the first and second metal electrode films are formed by stripes arranged alternately and extending parallel with each other in a second direction perpendicular to said first direction.

10. A semiconductor device according to claim 9, wherein each of said independent portions of the gate electrode film is formed in a middle enlarged portion in each of said unit cells.

11. A semiconductor device according to claim 10, wherein the width of the stripes of the first metal electrode film is wider than the width of the stripes of the second metal electrode film.

12. A semiconductor device according to claim 10, wherein said middle enlarged portion is larger than the remaining two enlarged portions in the same unit cell.

13. A semiconductor device according to claim 10, wherein the enlarged portions have a rectangular shape.

14. A semiconductor device according to claim 10, wherein the enlarged portions have an octagonal shape.

15. A semiconductor device according to claim 9, wherein said first, second and third semiconductor layers are formed of silicon.

16. A semiconductor device according to claim 15, wherein said first insulating layer is formed of silicon oxide.

17. A semiconductor device according to claim 15, wherein said gate electrode film is made of poly-silicon.

18. A semiconductor device according to claim 15, wherein said gate electrode film is made of a metal selected from the group consisting of Mo, Ni, Ti, Cr and metal silicides, said metals having relatively high melting points.

* * * * *

UNITED STATES PATENT AND TRADEMARK OFFICE
CERTIFICATE OF CORRECTION

PATENT NO. : 4,833,513

DATED : May 23, 1989

INVENTOR(S) : Yoshitaka SASAKI

It is certified that error appears in the above-identified patent and that said Letters Patent is hereby corrected as shown below:

Title page:

Please correct the fourth priority application to --

Apr. 26, 1985 [JP] Japan ........... 60-88492. --

Signed and Sealed this

Sixth Day of March, 1990

Attest:

JEFFREY M. SAMUELS

*Attesting Officer*    Acting Commissioner of Patents and Trademarks